(12) United States Patent
Jarvenpaa

(10) Patent No.: US 9,986,656 B2
(45) Date of Patent: May 29, 2018

(54) MULTI-RECEPTACLE HOUSING ASSEMBLY

(71) Applicant: Nissan North America, Inc., Franklin, TN (US)

(72) Inventor: Lynn E Jarvenpaa, Farmington Hills, MI (US)

(73) Assignee: Nissan North America, Inc., Franklin, TN (US)

( * ) Notice: Subject to any disclaimer, the term of this patent is extended or adjusted under 35 U.S.C. 154(b) by 193 days.

(21) Appl. No.: 14/972,343

(22) Filed: Dec. 17, 2015

(65) Prior Publication Data

US 2017/0181307 A1 Jun. 22, 2017

(51) Int. Cl.
| | | |
|---|---|---|
| *H05K 7/14* | (2006.01) | |
| *H01R 13/518* | (2006.01) | |
| *H05K 5/02* | (2006.01) | |
| *H01R 13/514* | (2006.01) | |
| *H01R 13/516* | (2006.01) | |

(Continued)

(52) U.S. Cl.
CPC ......... *H05K 7/1401* (2013.01); *H01R 13/514* (2013.01); *H01R 13/516* (2013.01); *H01R 13/518* (2013.01); *H05K 5/0247* (2013.01); *H01L 2924/01013* (2013.01); *H01L 2924/01029* (2013.01); *H01L 2924/01078* (2013.01); *H01L 2924/01079* (2013.01); *H01R 13/58* (2013.01); *H01R 13/6395* (2013.01); *H01R 13/74* (2013.01); *H01R 25/006* (2013.01); *H01R 25/162* (2013.01); *H01R 25/164* (2013.01);

(Continued)

(58) Field of Classification Search
CPC .. H05K 7/1401; H05K 5/0247; H05K 7/1405; H05K 7/1407; H01R 13/518; H01R 13/58; H01R 13/6395; H01R 13/74; H01R 25/006; H01R 25/162; H01R 25/164; H01R 4/48; H01R 24/78; H01R 13/514; H01R 13/516; H01L 2924/01013; H01L 2924/01029; H01L 2924/01078; H01L 2924/01079; H01L 2924/15311; H01L 2924/16135
See application file for complete search history.

(56) References Cited

U.S. PATENT DOCUMENTS 5,344,347 A * 9/1994 Inoue ................... H01R 13/193
439/701
5,443,403 A * 8/1995 Weidler ............... H01R 13/518
439/557

(Continued)

*Primary Examiner* — Ishwarbhai B Patel
*Assistant Examiner* — Paresh Paghadal

(57) ABSTRACT

A multi-receptacle housing assembly that includes a clamping assembly and a cover. The clamping assembly defines a first clamping section, a second clamping section and a cover support section. The first clamping section is located along a first side of the clamping assembly and is configured to clamp to a projection of an electronic device housing. The second clamping section is located along a second side of the clamping assembly opposite the first side and is configured to receive and support a plurality of electric receptacles. The cover removably is connected to the cover support section of the clamping assembly at least partially covering the first clamping section and the cover support section. The cover defines an opening dimensioned to expose at least a portion of the second clamping section and the plurality of electric receptacles.

20 Claims, 11 Drawing Sheets

(51) Int. Cl.
  *H01R 13/58*    (2006.01)
  *H01R 25/16*    (2006.01)
  *H01R 13/639*   (2006.01)
  *H01R 25/00*    (2006.01)
  *H01R 13/74*    (2006.01)

(52) U.S. Cl.
  CPC ......... *H05K 7/1405* (2013.01); *H05K 7/1407* (2013.01)

(56) References Cited

U.S. PATENT DOCUMENTS

| | | | |
|---|---|---|---|
| 6,202,565 B1* | 3/2001 | Henry | A62C 33/06 104/275 |
| 8,292,660 B2* | 10/2012 | Allwood | H01R 9/2416 439/540.1 |
| 9,257,788 B1* | 2/2016 | Jia | H01R 13/518 |
| 2004/0235344 A1* | 11/2004 | Kleeberger | H01R 13/6215 439/540.1 |
| 2004/0242081 A1* | 12/2004 | Otto | H01R 9/24 439/709 |
| 2006/0286824 A1* | 12/2006 | Busse | H01R 12/721 439/65 |
| 2013/0178098 A1* | 7/2013 | Terajima | H01R 13/521 439/587 |
| 2015/0038018 A1* | 2/2015 | Matsuzawa | H01R 12/716 439/638 |

* cited by examiner

MULTI-RECEPTACLE HOUSING ASSEMBLY

BACKGROUND

Field of the Invention

The present invention generally relates to a multi-receptacle housing assembly. More specifically, the present invention relates to a multi-receptacle housing assembly that clamps to a electrical device, such as a multiplexer, and supports a plurality of electric receptacles that are electrically connected to electric contacts of the multiplexer.

Background Information

During a vehicle designing and fabricating process, various tests are conducted on the various vehicle body structures and the various vehicle systems. For example, stress tests are conducted on the vehicle body structures to determine the structural integrity of the design. Further, systems such as the air conditioning system of a vehicle are tested to ensure that the air conditioning system properly conditions (heats and cools) all areas within a passenger compartment within the vehicle body structure.

During such tests, various sensors are attached at predetermined locations on the vehicle body structure. In some tests, hundreds of sensors can be used to collect data during testing. Each of these sensors is typically connected to a multiplexing unit that processes the signals from the plurality of sensors such that the signals can then be stored for processing by a computer. The multiplexing unit can be configured to connect to, for example, 25 different sensors used during vehicle testing. The sensors are electrically connected to the multiplexing unit via a plurality of cables. Each cable is connected at a first end to one of the sensors. A second end of each cable is connected to the multiplexing unit.

The process of attaching the cables to the sensors and to the multiplexing unit is time consuming and cumbersome.

SUMMARY

One object of the disclosure is to provide a multiplexing unit with a housing that attaches to the multiplexing unit and that supports a plurality of electric receptacles in order to simplify the process of connecting sensors to the multiplexing unit.

In view of the state of the known technology, one aspect of the present disclosure is to provide a multi-receptacle housing assembly with a clamping assembly and a cover. The clamping assembly defines a first clamping section, a second clamping section and a cover support section. The first clamping section is located along a first side of the clamping assembly and is configured to clamp to a protrusion of an electronic device housing. The second clamping section is located along a second side of the clamping assembly opposite the first side and is configured to receive and support a plurality of electric receptacles. The cover removably is connected to the cover support section of the clamping assembly at least partially covers the first clamping section and the cover support section. The cover defines an opening dimensioned to expose at least a portion of the second clamping section and the plurality of electric receptacles.

BRIEF DESCRIPTION OF THE DRAWINGS

Referring now to the attached drawings which form a part of this original disclosure.

DETAILED DESCRIPTION OF EMBODIMENTS

Selected embodiments will now be explained with reference to the drawings. It will be apparent to those skilled in the art from this disclosure that the following descriptions of the embodiments are provided for illustration only and not for the purpose of limiting the invention as defined by the appended claims and their equivalents.

Figure 1:
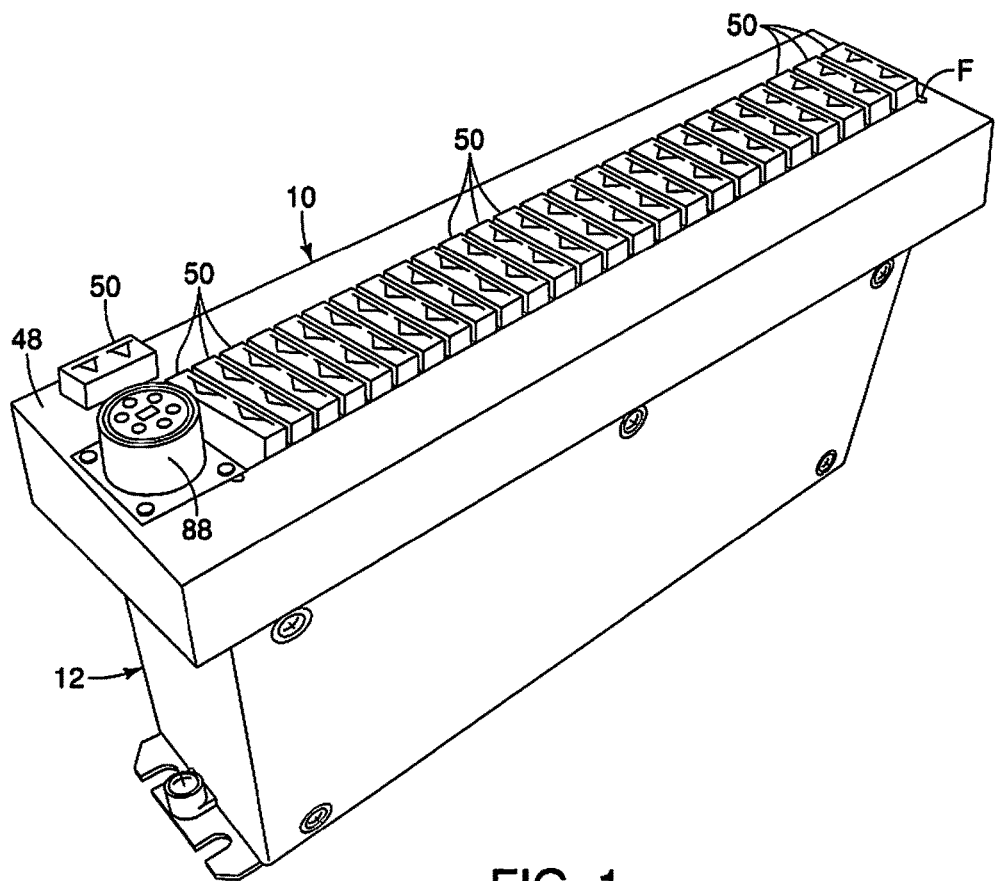
FIG. 1 is a perspective view of a multi-receptacle housing assembly fixed to a top portion of a housing of an electric device in accordance with a first embodiment.

Referring initially to FIG. 1, a multi-receptacle housing assembly 10 attached to an electric device 12 is illustrated in accordance with a first embodiment. As is described in greater detail below, the multi-receptacle housing assembly 10 is configured to install to the electric device 12 in order to simplify and enhance usage and operation of the electric device 12. A detailed description of the multi-receptacle housing assembly 10 is provided below following a brief description of the electric device 12.

The electric device 12 is a conventional device that can be any of a variety of electronic devices. In the embodiment depicted in FIG. 2, the electric device 12 is a multiplexing device configured to connect to, for example, up to twenty five (25) sensors 16 (described below) and to a computer 18. In the depicted embodiment, the electric device 12 is an AM25T Multiplexer manufactured by Campbell Scientific®. However, as will be understood from the drawings and the description herein below, the multi-receptacle housing assembly 10 can be installed to and used with any of a variety of electric devices and is not limited to use with the AM25T Multiplexer manufactured by Campbell Scientific®.

In the depicted embodiment, the electric device 12 is configured to process and transmit the signals from the sensors 16 to the computer 18. The computer 18 collects the transmitted data and processes the received data for later engineering analysis. The electric device 12 is connected to the computer 18 via a cable C such that there is reliable data transmission between the electric device 12 and the computer 18.

Figure 2:
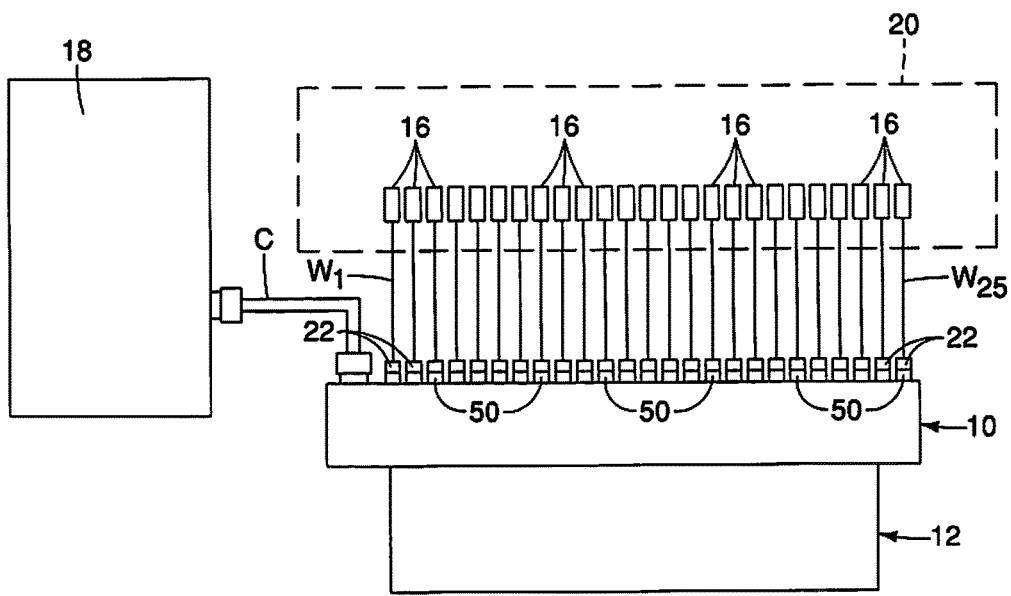
FIG. 2 is a schematic view of the multi-receptacle housing assembly connected to the electric device, a plurality of sensors and a computer, showing a plurality of sensors installed within a vehicle body structure in order to collect data from within the vehicle body structure, transmit collected data to the electric device which then transmits the data to the computer in accordance with the first embodiment.

As shown in FIG. 2, the electric device 12 is electrically connected to the plurality of sensors 16 used to monitor a predetermined parameter within a vehicle 20. In the depicted embodiment, each of the plurality of sensors 16 is a thermocouple configured to measure temperature within the vehicle 20 while testing an air conditioning system (not shown) that is included within the vehicle 20. During design and construction of the vehicle 20 various tests are conducted.

It should be understood from the drawings and the description herein that the plurality of sensors 16 can be any of a variety of sensors, such as strain gauges or temperature sensors, depending upon the type tests being conducted on the vehicle 20. However, in the depicted embodiment, the sensors 16 are thermocouples configured to measure temperature changes and provide signals indicative of temperature changes to the electric device 12.

In the test depicted in FIG. 2, there are twenty five (25) sensors 16 installed at differing locations within the vehicle 20. The vehicle 20 is shown schematically. The vehicle 20 can be a sedan, a coupe, a pickup truck, SUV or any other vehicle design. The number of sensors 16 is based upon the capability and configuration of the electric device 12. In the depicted embodiment, the electric device 12 is configured to connect to twenty five (25) sensors 16. However, it should be understood that the electric device 12 can be configured to connect to fewer than twenty five (25) or more that twenty five (25) sensors 16 and is not limited to the number depicted. Further, several electric devices 12 and corresponding multi-receptacle housing assemblies 10 can be employed within a single vehicle 20 during any given test.

As shown in FIG. 2, each of the twenty five (25) sensors 16 is connected via corresponding cables $W_1$-$W_{25}$ to a corresponding one of plugs 22. The plugs 22 are described in greater detail below.

Figure 3:
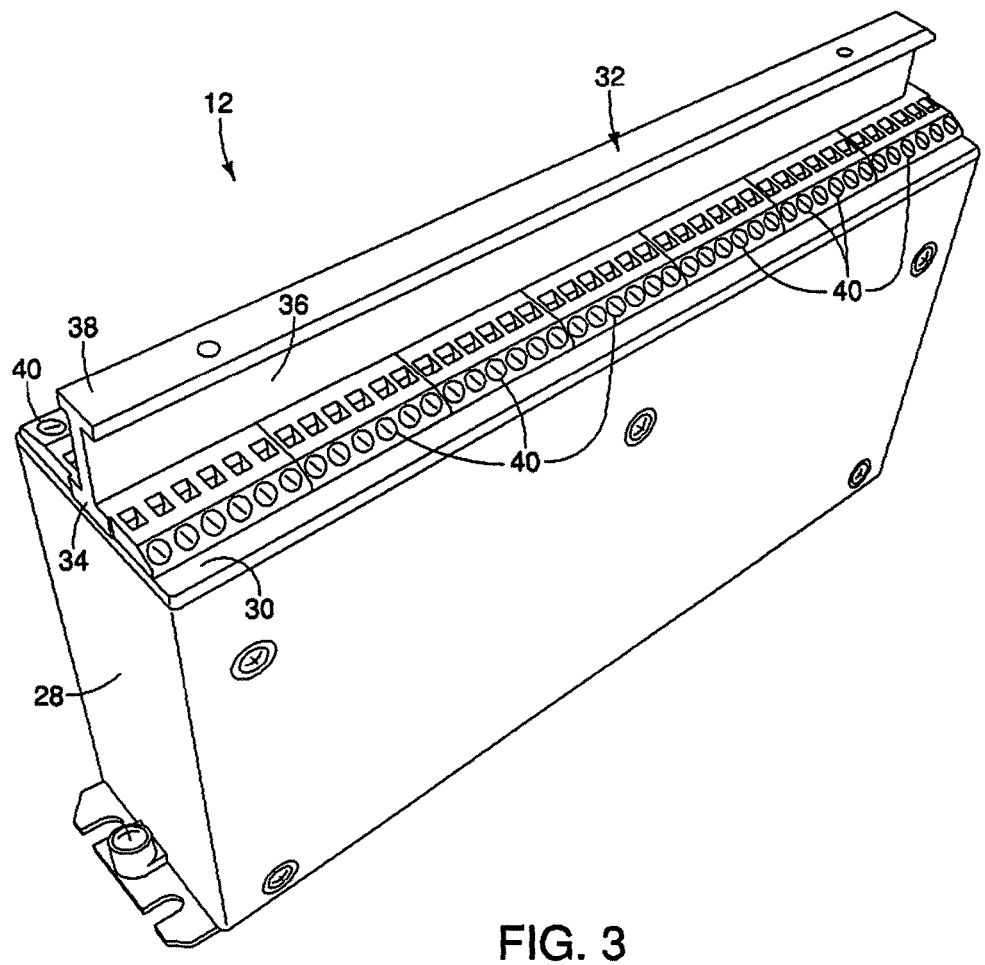
FIG. 3 is a perspective view of the electric device with the multi-receptacle housing assembly removed to show an upper protrusion or bracket that the multi-receptacle housing assembly attaches to in accordance with the first embodiment.
Figure 4:
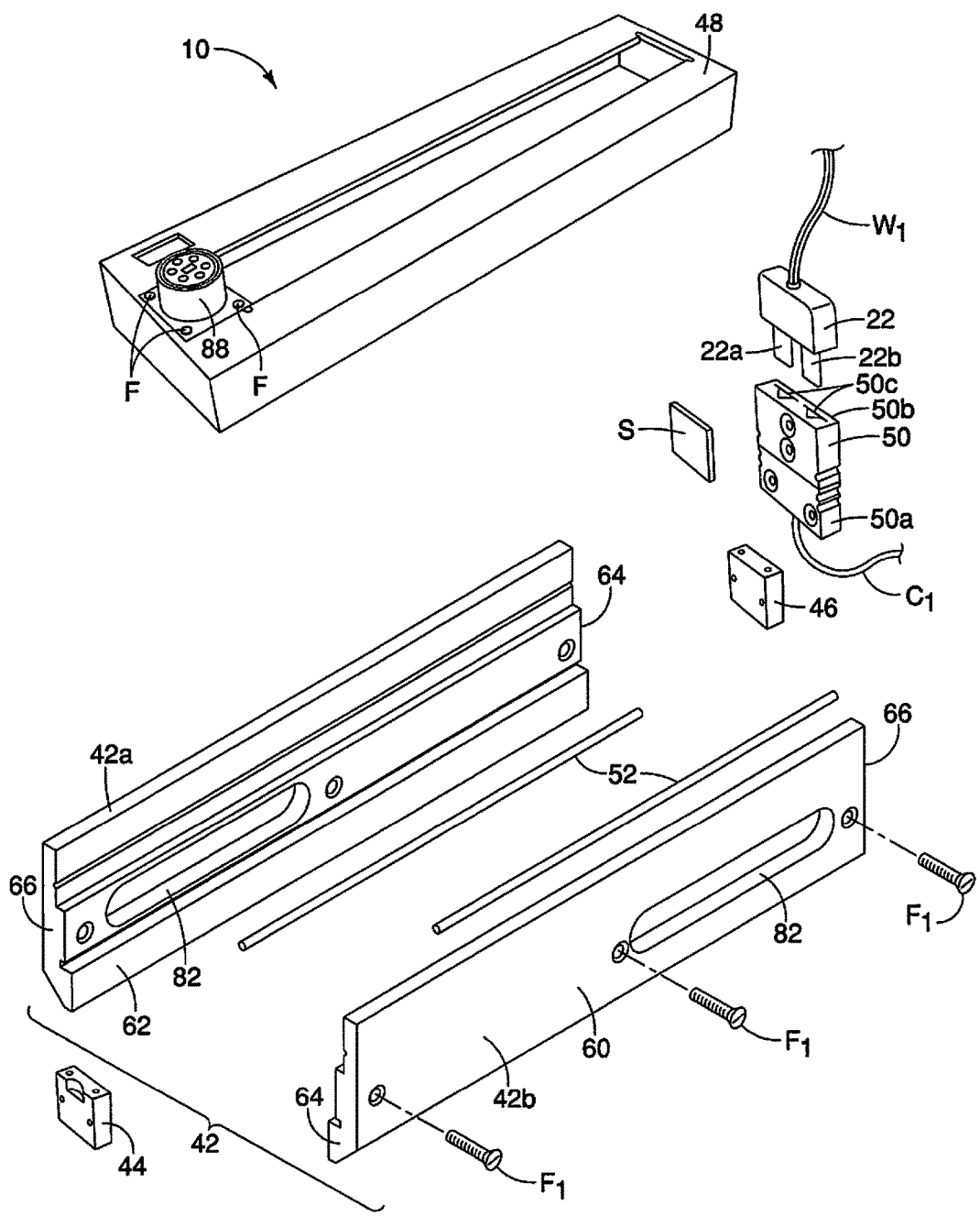
FIG. 4 is an exploded perspective view the multi-receptacle housing assembly and the electric device showing the housing of the electric device and elements of the multi-receptacle housing assembly including a first clamping section, a second clamping section, a pair of retaining rods, one of a plurality of electric receptacles, end blocks and a cover in accordance with the first embodiment.
Figure 9:
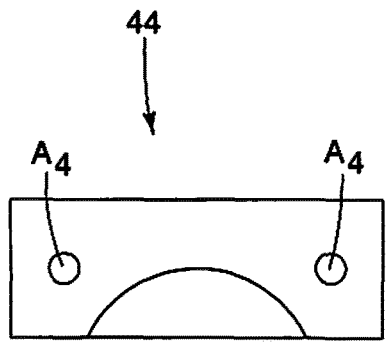
FIG. 9 is a top view of a first end block of the multi-receptacle housing assembly in accordance with the first embodiment.
Figure 11:
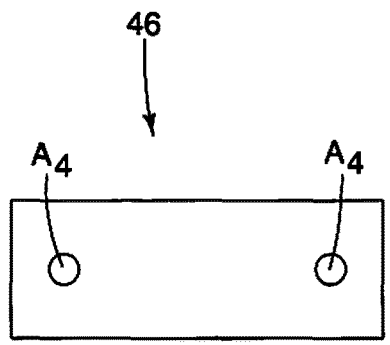
FIG. 11 is a top view of a second end block of the multi-receptacle housing assembly in accordance with the first embodiment.
Figure 10:
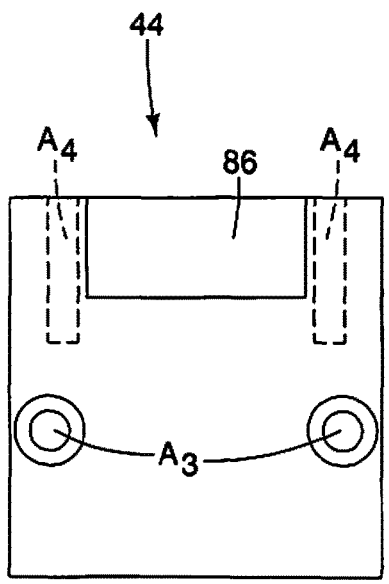
FIG. 10 is an end view of the first end block of the multi-receptacle housing assembly in accordance with the first embodiment.
Figure 12:
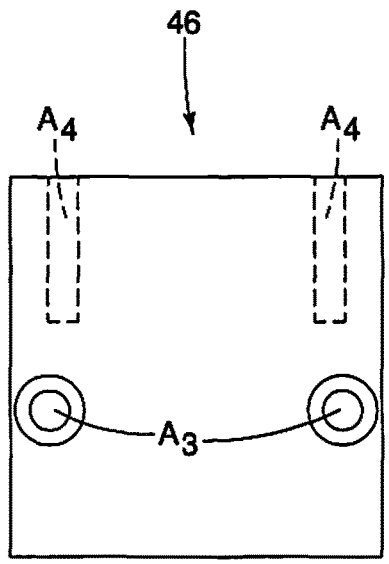
FIG. 12 is an end view of the second end block of the multi-receptacle housing assembly in accordance with the first embodiment.

A brief description of the electric device 12 is now provided with reference to FIG. 3. As shown in FIG. 3, the electric device 12 includes a main housing 28 that houses electronics that receive and process signals received from the sensors 16. Since such electronics are conventional, further description is omitted for the sake of brevity. The main housing 28 includes an upper surface 30 and a central projection 32 that extends along a center of the upper surface 30 and along the length of the main housing 28 from one end thereof to the other end thereof. As shown in FIGS. 3, 4 and 9, the central projection 32 has an I-beam-like shape as viewed from either end thereof with a lower flange 34, a main flange portion 36 and an upper flanges 38. The lower flange 34 is rigidly fixed to the main housing 28 by fasteners or welding.

The upper surface 30 of the main housing 28 also includes a plurality of first electric contacts 40. More specifically, there are two rows of first electric contacts 40, one on either side of the central projection 32. There is a first group of the first electric contacts 40 located along a first side of the central projection 32 and a second group of the first electric contacts 40 along a second side of the central projection 32. Each of the first electric contacts 40 serves a specific purpose. For example, a majority of the first electric contacts 40 are configured to be electrically connected to corresponding ones of the sensor 16. Specifically, in the depicted embodiment, the first electric contacts 40 are designated for connection to corresponding ones of the sensors 16. Further, some of the first electric contacts 40 are configured for connection to the computer 18. Since these specific connection assignments are known via documentation available from Campbell Scientific®, further description of designated use and purpose of each of the first electric contacts 40 is omitted for the sake of brevity.

A description of the multi-receptacle housing assembly 10 is now provided with initial reference to FIGS. 4-16. The multi-receptacle housing assembly 10 includes a clamping assembly 42, a first end block 44, a second end block 46, a cover 48, a plurality of electric receptacles 50 and retaining rods 52.

The clamping assembly 42 includes a first clamping member 42a, a second clamping member 42b and mechanical fasteners $F_1$ that threadedly connecting the first clamping member 42a to the second clamping member 42b. Specifically, when the fasteners $F_1$ are installed to the first and second clamping members 42a and 42b and are rotated clamping force can be generated between the first clamping member 42a and the second clamping member 42b, as described in greater detail below.

Figure 5:
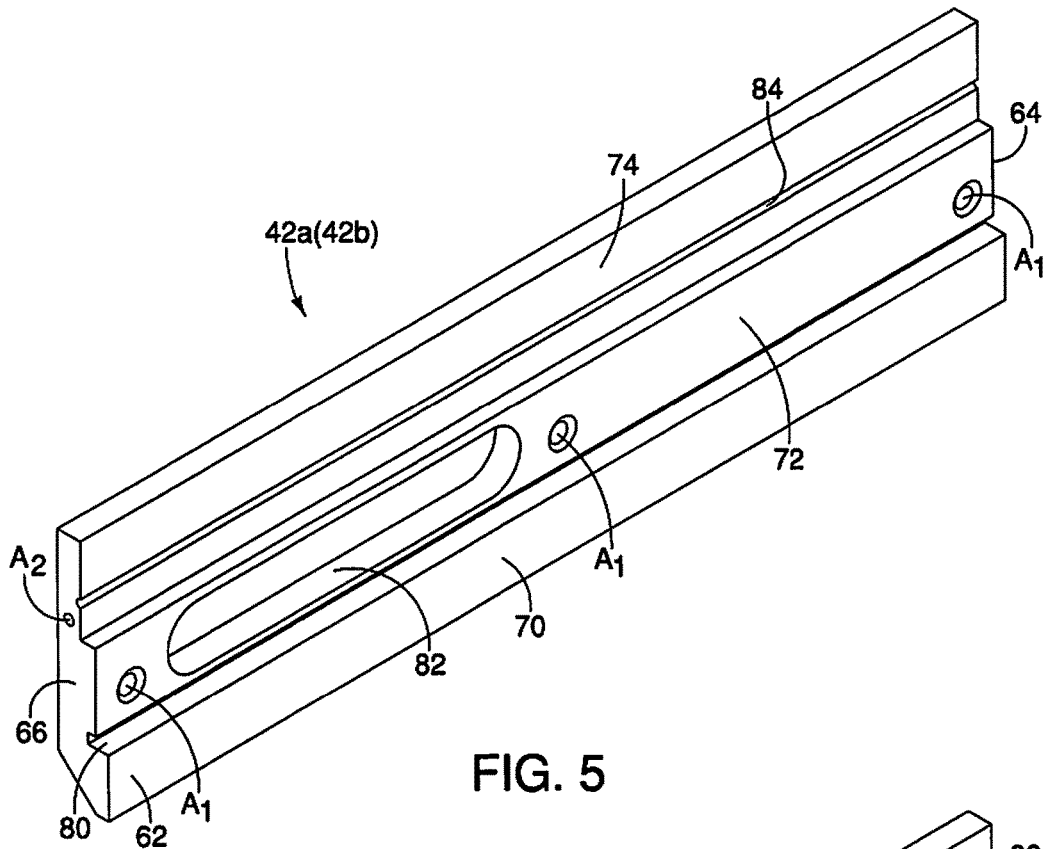
FIG. 5 is a perspective view of the first clamping section of the multi-receptacle housing assembly in accordance with the first embodiment.
Figure 6:
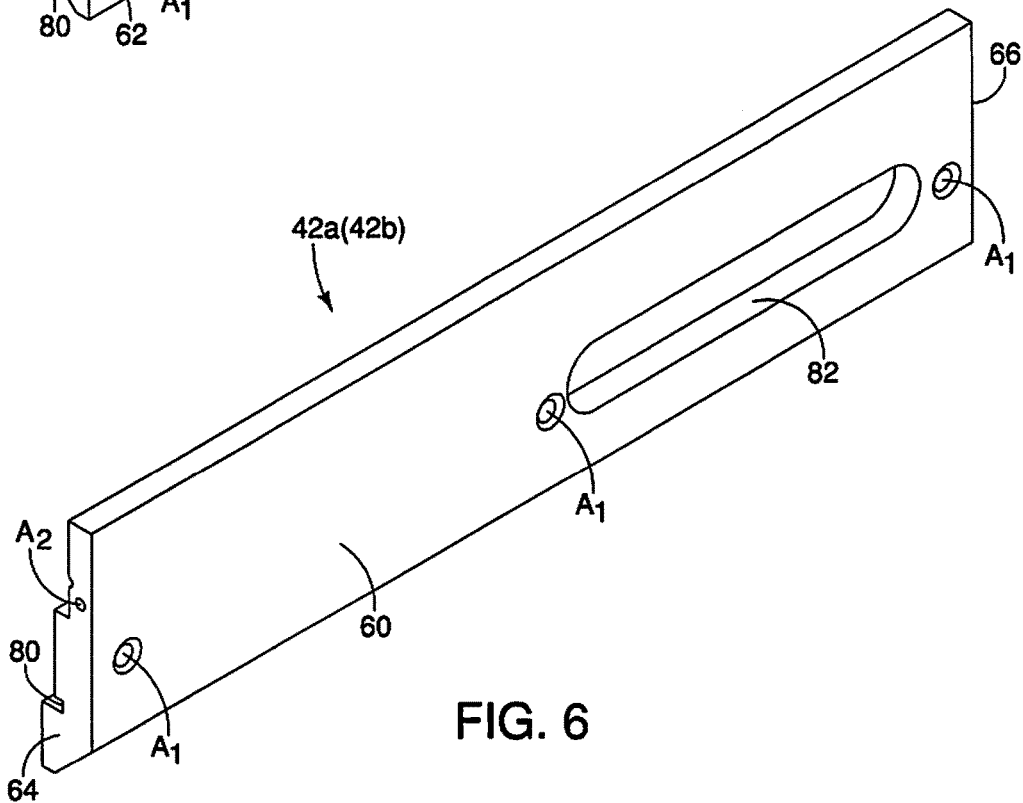
FIG. 6 is a perspective view of the second clamping section of the multi-receptacle housing assembly in accordance with the first embodiment.

The first clamping member 42a and the second clamping member 42b are basically identical is shape and dimensions. Therefore, description of one applies equally to both. As shown in FIGS. 5 and 6, the first clamping member 42a (and the second clamping member 42b) is an elongated plate-like shape defining an outer side 60, a clamping side 62, a first end surface 64 and a second end surface 66.

The outer side 60 is basically a flat surface with a lower edge that tapers downward toward the clamping side 62. The outer side 60 includes three apertures $A_1$ that extend through the first clamping member 42a to the clamping side 62. The apertures $A_1$ are dimensioned to receive the mechanical fasteners $F_1$ used to draw the first clamping member 42a and the second clamping member 42b together in order to clamp on to the central projection 32, as is described in greater detail below.

Figure 7:
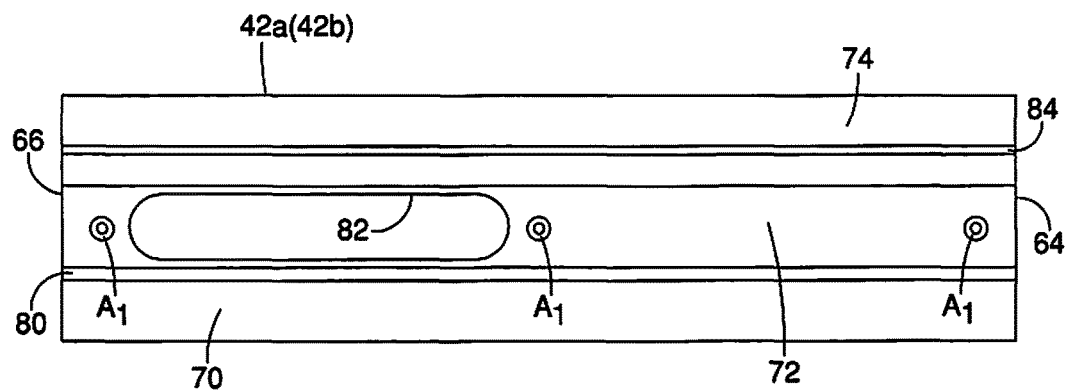
FIG. 7 is an inner side view of one of the first and second clamping sections in accordance with the first embodiment.
Figure 8:
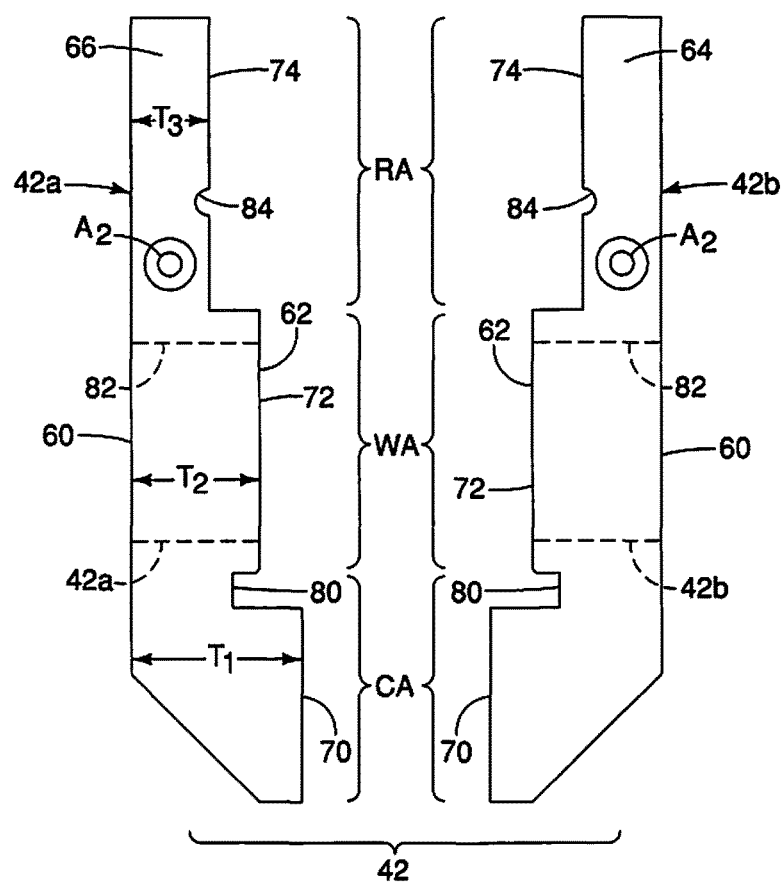
FIG. 8 is an end view of the first and second clamping sections in accordance with the first embodiment.

As shown in FIGS. 5, 6 and 7, the clamping side 62 includes a clamping surface 70, an mid-surface 72 and a receptacle receiving surface 74 that are all parallel to one another, and are not co-planar. As shown in FIG. 8, the first clamping member 42a has a first thickness $T_1$ at the clamping surface 70, a second thickness $T_2$ at the mid-surface 72 and a third thickness $T_3$ receptacle receiving surface 74. More specifically, the first thickness $T_1$ is measured between the clamping surface 70 and the outer side 60. The second thickness $T_2$ is measured between the mid-surface 72 and the outer side 60. The third thickness $T_3$ is measured between the receptacle receiving surface 74 and the outer side 60.

The first clamping member 42a (and the second clamping member 42b) has a first recessed area 80 dimensioned to receive the upper flange 38 of the central projection 32 of the electronic device 12. The first recessed area 80 is formed between the clamping surface 70 and the mid-surface 72.

Figure 17:
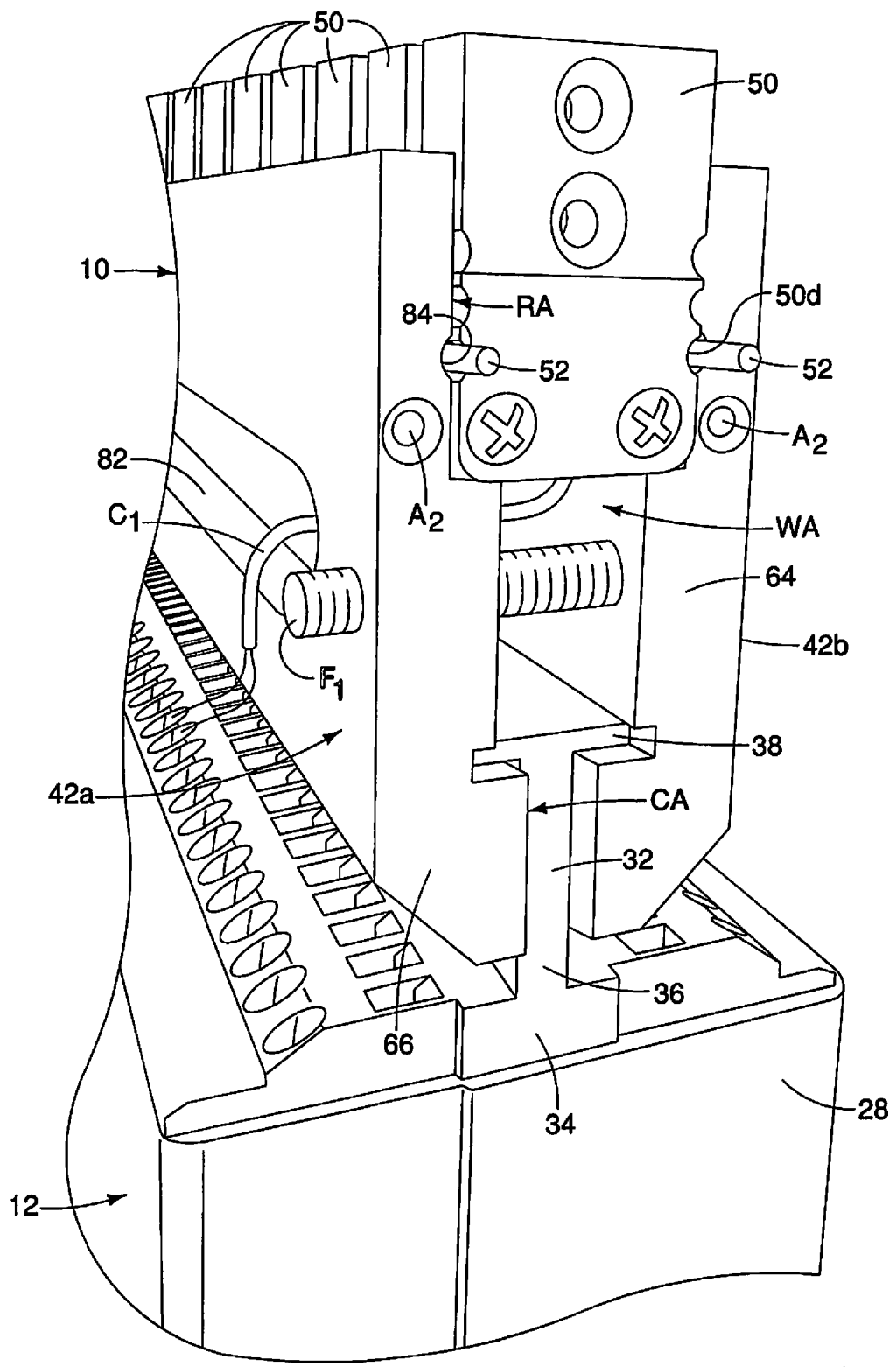
FIG. 17 is a perspective view one end of the electric device with the first and second clamping sections attached to the upper protrusion with the cover removed showing the pair of retaining rods retaining the electric receptacles between the first and second clamping sections of the multi-receptacle housing assembly in accordance with the first embodiment.

As shown in FIG. 8, the clamping surface 70 and the first recessed area 80 define a clamping area CA (a first clamping section). More specifically, as shown in FIG. 17, the clamping surface 70 and the first recessed area 80 are dimensioned such that when the first clamping member 42a and the second clamping member 42b together the clamping surface 70 contacts the main flange portion 36 thereby clamping on to the central projection 32, and the upper flange 38 is received in the first recessed area 80.

As shown in FIGS. 5 and 7, the mid-surface 72 is a planar surface that includes a cable receiving opening 82 that extends from the mid-surface 72 to the outer side 60. The cable receiving opening 82 is located adjacent to the second end surface 66 of the first clamping member 42a (and the second clamping member 42b). More specifically, the cable receiving opening 82 is located between two of the apertures $A_1$, with one of the two of the apertures $A_1$ being centered between the first end surface 64 and the second end surface 66, and the second of the two the apertures $A_1$ being located adjacent to the second end surface 66. As indicated in FIG. 4, when the first clamping member 42a and the second clamping member 42b are clamped to one another, the cable receiving opening 82 of the first clamping member 42a does not align with the cable receiving opening 82 of the second clamping member 42a.

As indicated in FIG. 8, the mid-surface 72 of the first clamping member 42a and the mid-surface 72 of the second clamping member 42b define a cable receiving area WA. The cable receiving area WA is explained in greater detail below.

The receptacle receiving surface 74 is a planar surface that is interrupted only by a rod receiving recess 84. The rod receiving recess 84 is an elongated recess dimensioned to receive a corresponding one of the retaining rods 52, as is explained in greater detail below. A step surface 74a extends from the mid-surface 72 to the receptacle receiving surface 74 and is perpendicular to the mid-surface 72 and the receptacle receiving surface 74. As indicated in FIG. 8, the receptacle receiving surface 74 and the step surface 74a of the first clamping member 42a, and the receptacle receiving surface 74 and the step surface 74a of the second clamping member 42b define a receptacle receiving area RA (a second recessed area, also referred to as a second clamping section). The receptacle receiving area RA is dimensioned to receive the plurality of the electric receptacles 50, as is explained in greater detail below.

The first end surface 64 and the second end surface 66 both include apertures $A_2$ that are provided for the attachment of the first and second end blocks 44 and 46, as is explained in greater detail below.

A description of the first end block 44 and the second end block 46 is now provided with specific reference to FIGS. 9-12. The first and second end blocks 44 and 46 are for providing an attachment connection between the first and second clamping members 42a and 42b and the cover 48. The first end block 44 is a block of material that has an overall rectangular shape and includes a circular shaped recess 86 to accommodate cables that are connected to a connector 88 on the cover 48. The first end block 44 includes apertures $A_3$ that extend horizontally through the first end block 44 and apertures $A_4$ that extend vertically downward from an upper surface thereof. The apertures $A_3$ are dimensioned to receive fasteners F that further insert into the apertures $A_2$ at respective first and second end surfaces 64 and 66 of the first and second clamping members 42a and 42b. The apertures $A_4$ are dimensioned to receive fasteners F that are inserted through an opening (described below) of the cover 48.

The second end block 46 is also a block of material that has an overall rectangular shape. The second end block 46 also includes apertures $A_3$ that extend horizontally through the second end block 46 and apertures $A_4$ that extend vertically downward from an upper surface thereof. Like the first end block 44, the apertures $A_3$ of the second end block 46 are also dimensioned to receive fasteners F that further insert into the apertures $A_2$ at respective first and second end surfaces 64 and 66 of the first and second clamping members 42a and 42b. The apertures $A_4$ are dimensioned to receive fasteners F that are inserted through openings in the cover 48.

Figures 13, 14:
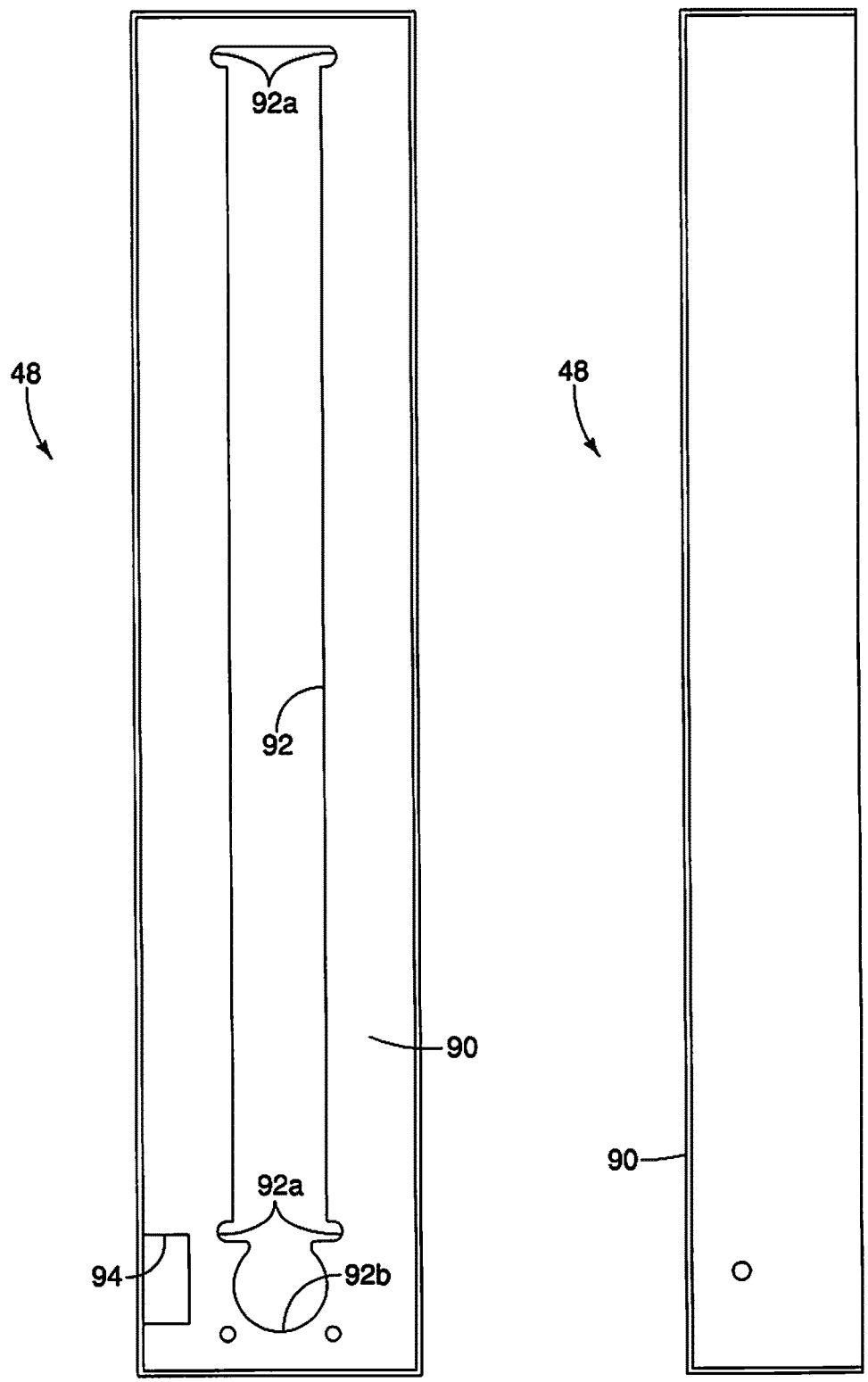
FIG. 13 is a top view of the cover of the multi-receptacle housing assembly in accordance with the first embodiment.
FIG. 14 is a side view of the cover of the multi-receptacle housing assembly in accordance with the first embodiment.
Figure 15:
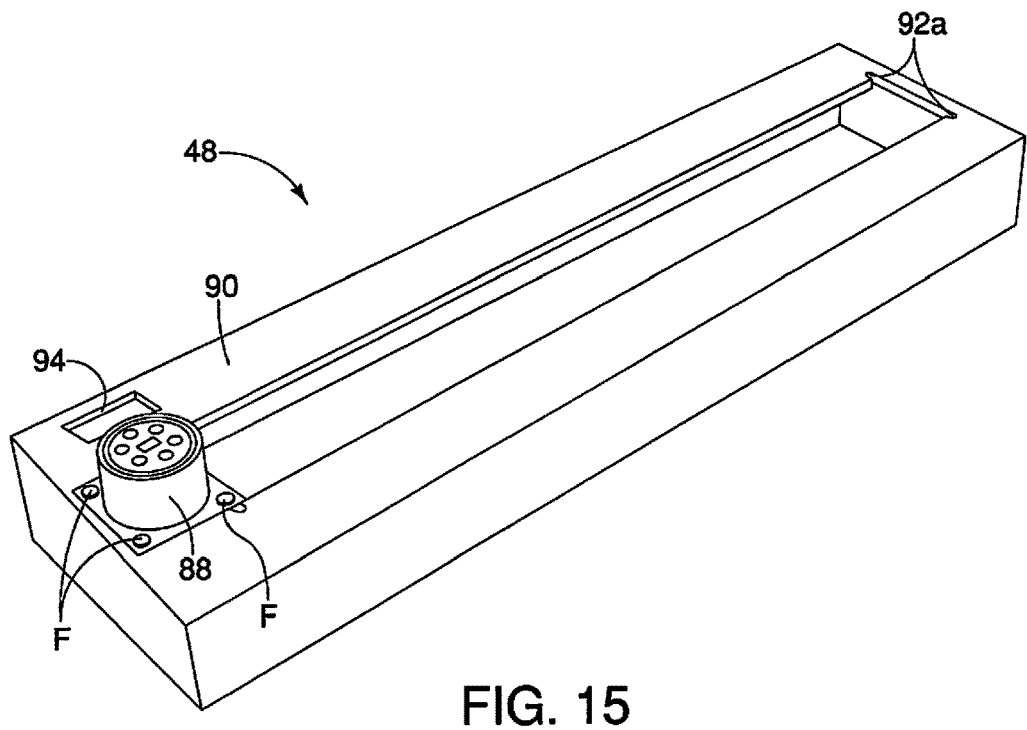
FIG. 15 is a perspective view of the cover of the multi-receptacle housing assembly in accordance with the first embodiment.

A description of the cover 48 is now provided with specific reference to FIGS. 13, 14 and 15. The cover 48 has an overall rectangular shape with four orthogonal sides. The bottom of the cover 48 is open such that the cover 48 can be installed over the clamping assembly 42 and the upper portion of the electric device 12. A top surface 90 of the cover 48 is at least partially closed. However, the top surface 90 of the cover 48 defines a first opening 92 and a second opening 94. The first opening 92 is an elongated slot dimensioned such that upper portions of twenty five (25) of the electric receptacles 50 can extend through the first opening 92. The first opening 92 include recesses 92a at the four corners thereof, and a round cutout 92b. The recesses 92a are provided to receive fasteners that extend through the recesses 92a and into the apertures $A_4$ of the first and second end blocks 44 and 46. The cutout 92b is provided to accommodate cables attached to the connector 88 (shown in FIG. 15). The second opening 94 is a small rectangular opening dimensioned to receive one of the electric receptacles 50.

In the multi-receptacle housing assembly 10, there are a total of twenty six (26) of the electric receptacles 50. As mentioned above, one of the electric receptacles 50 is installed to the cover 48 such that the one of the electric receptacles 50 extends through the second opening 94.

Figure 16:
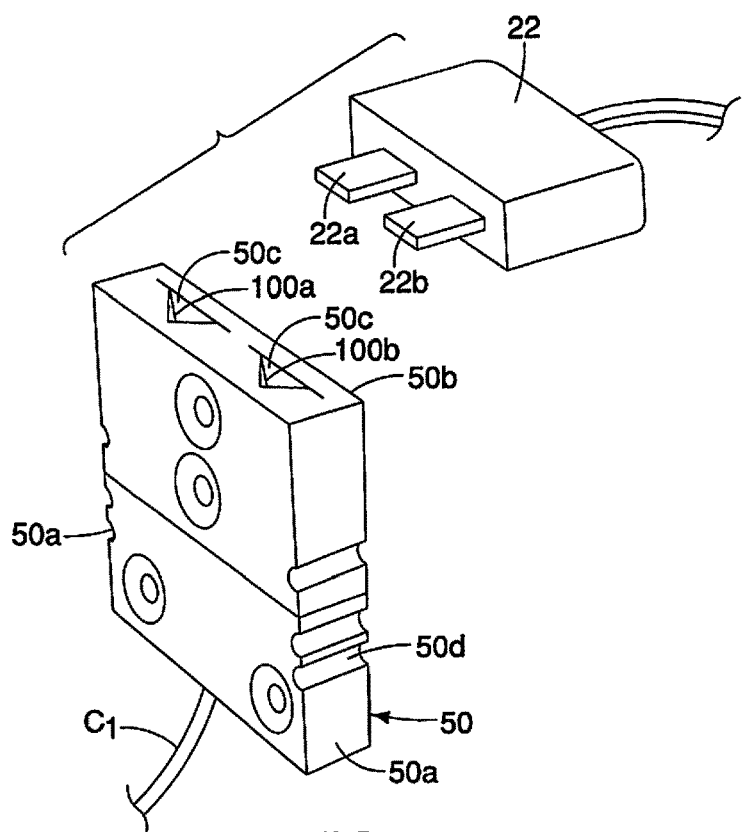
FIG. 16 is a perspective view of one of the plurality of electric receptacles of the multi-receptacle housing assembly in accordance with the first embodiment.

Twenty five (25) of the electric receptacles 50 are installed to the receptacle receiving area RA (the second recessed area) of the clamping assembly 42. One of the electric receptacles 50 is shown in FIG. 16. Since all of the electric receptacles 50 are the same, description of one applies equally to all of the electric receptacles 50. Each of the electric receptacles includes a clamping end 50a, and a terminal end 50b. The terminal end 50b includes electrical connector openings 50c with electrical connectors 100a and 100b disposed therein, as shown in FIG. 16.

The electric receptacle 50 in FIG. 16 is part of an electrical connector assembly that includes the electric receptacle 50 (female portion of jack) and the plug 22 (male portion of jack) mentioned above. Such electric connectors 50 and plugs 22 are commercially available from, for example, Watlow® or Omega® Engineering. Each of the plugs 22 includes exposed electric pins 22a and 22b that are inserted into the electrical connector openings 50c.

Figure 18:
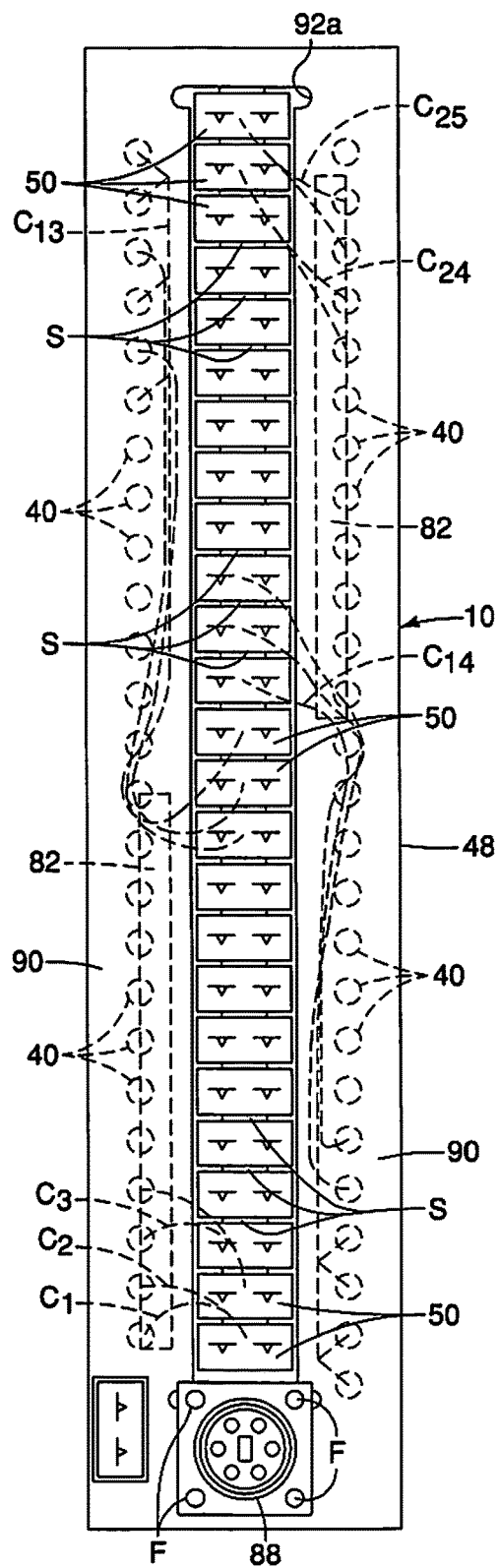
FIG. 18 is a top view of the multi-receptacle housing assembly fully assembled in accordance with the first embodiment.
Figure 19:
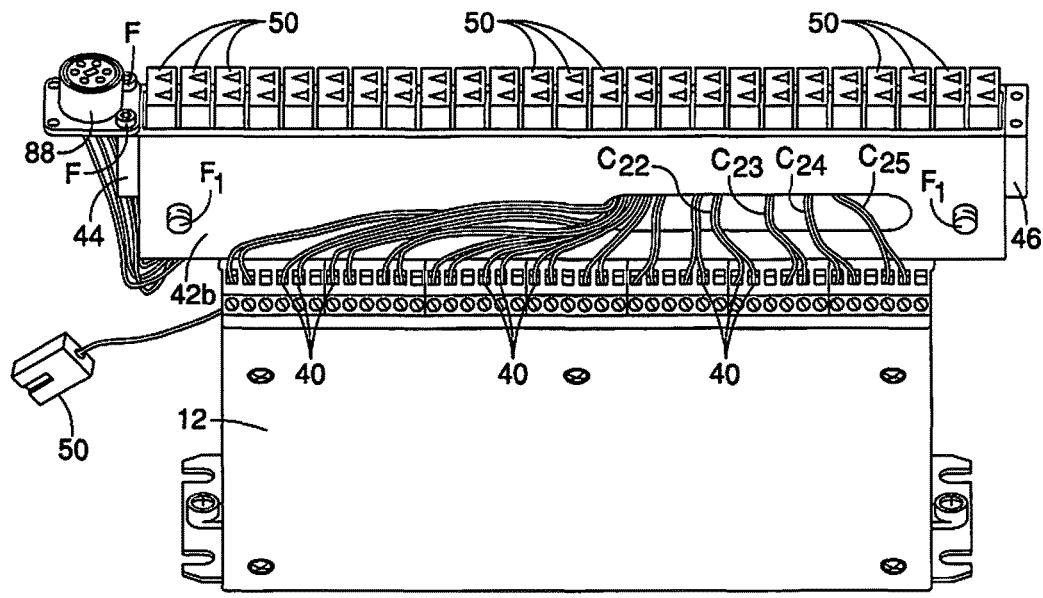
FIG. 19 is a first side view of the multi-receptacle housing assembly with the cover removed showing wiring connecting the electrical device to a first portion of the plurality of electric receptacles in accordance with the first embodiment.
Figure 20:
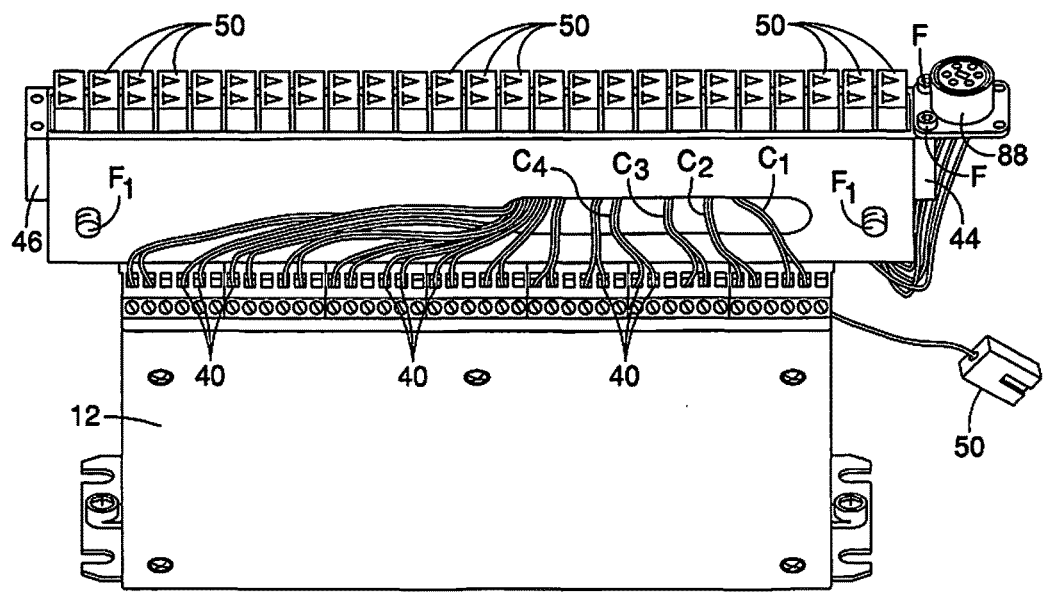
FIG. 20 is a second side view of the multi-receptacle housing assembly with the cover removed showing wiring connecting the electrical device to a second portion of the plurality of electric receptacles in accordance with the first embodiment.

Each of the plugs 22 is connected to a corresponding one of the sensors 16 via one of the cables $W_1$-$W_{25}$, as shown in FIG. 1 and the plugs 22 are then removably connected to a corresponding electric receptacle 50. The electric receptacle 50 basically serves as a female electric outlet into which male terminals of the plug 22 are inserted. Each of the plurality electric receptacle 50 has a pair of electric contacts 100a and 100b that are connected to corresponding cables $C_1$-$C_{25}$. As shown in FIGS. 18, 19 and 20, wires within the cables $C_1$-$C_{25}$ extend through the wire receiving area WA of the clamping assembly 42 (defined by the first clamping member 42a and the second clamping member 42b). Wires within the cables $C_1$-$C_{25}$ are then attached to corresponding ones of the first electric contacts 40 of the electric device 12. Specifically, approximately half of the cables $C_1$-$C_{25}$ extend through the wire receiving opening 82 in the first clamping member 42a and the other half of the cables $C_1$-$C_{25}$ extend through the wire receiving opening 82 in the second clamping member 42b. For example, in the depicted example, wires of the cables $C_1$-$C_{13}$ that extend through the wire receiving opening 82 in the first clamping member 42a are attached to the first electric contacts 40 on a first side of the electric device 12. Wires of the cables $C_{14}$-$C_{25}$ that extend through the wire receiving opening 82 in the second clamping member 42b are attached to the first electric contacts 40 on a second side of the electric device 12.

In FIG. 17, only one of the cables $C_1$-$C_{13}$ is shown for the sake of simplicity. It should be understood that all of the cables $C_1$-$C_{13}$ connected to the first thirteen electric receptacles 50 are similarly routed through the wire receiving opening 82 in the first clamping member 42a. Similarly, in FIG. 18 only a portion of the cables $C_1$-$C_{25}$ are depicted for the sake of simplicity.

Returning to FIG. 16, each of the electric receptacles 50 has an outer housing with a rectangular shape and includes attachment apertures that can receive fasteners. Opposite sides of the electric receptacle 50 include recesses 50d on opposite edges thereof. The recesses 50d are dimensioned to receive the retaining rods 52, as shown in FIG. 17.

During assembly of the multi-receptacle housing assembly 10, the first and second clamping members 42a and 42b are loosely installed to the central projection 32 of the electric device 12. During this stage of the assembly process, the upper flange 38 inserts into the first recessed areas 80 of the first and second clamping members 42a and 42b and the main flange portion 36 of the central projection 32 is located within the clamping area CA between the first and second clamping members 42a and 42b. The fasteners $F_1$ are not completely tightened at this point. Thereafter, all twenty five (25) of the electric receptacles 50 can be lined up and held together by grasping the retaining rods 52. The twenty five (25) electric receptacles and the retaining rods 52 can then be inserted (with the cables $C_1$-$C_{25}$) into the receptacle receiving area RA with the cables $C_1$-$C_{25}$ being fed into the wire receiving area WA and through the appropriate one of the wire receiving openings 82 of the first and second clamping members 42a and 42b.

At this point, optional spacers S can be inserted between adjacent ones of the electric receptacles 50, as shown in FIG. 18. Inclusion of the spaces S provides sufficient space for connection of the plugs 22 to corresponding ones of the electric receptacles 50. After the spacers S are inserted between adjacent ones of the electric receptacles 50, the fasteners $F_1$ are rotated. It should be understood that rotation of the mechanical fasteners $F_1$ changes clamping force between the first clamping member 42a and the second clamping member 42b at the clamping area CA (a first clamping section). Tightening of the fasteners $F_1$ also secures the electric receptacles 50 within the receptacles receiving area RA due to the inclusion of the retaining rods 52 and clamping force applied by contact between the electric receptacles 50 and the receptacles receiving surfaces 74 of the first clamping member 42a and the second clamping member 42b.

Once the first clamping member 42a and the second clamping member 42b are secured to the central projection 32 of the electric device 12, and wires of the cables $C_1$-$C_{25}$ are connected to appropriate ones of the first electric contacts 40, the first end block 44 and the second end block 46 are installed to respective ends of the first clamping member 42a and the second clamping member 42b via fasteners inserted through the apertures $A_3$ of the first and second end blocks 44 and 46 and threaded into the apertures $A_4$ of the first and second clamping members 42a and 42b. Thereafter, the cover 48 is installed over the first and second clamping members 42a and 42b with the upper ends of the electric receptacles 50 extending through the first opening 92. Fasteners F are then inserted through the recesses 92a and into the apertures $A_4$ of the first and second end blocks 44 and 46, thereby securing the cover 48 to the first and second end blocks 44 and 46, the first and second clamping members 42a and 42b and the electric device 12.

The cover 48 can be easily removed by removing the fasteners F. Similarly the first and second clamping members 42a and 42b can be loosened and removed by loosening the fasteners $F_1$.

The electric device 12 includes conventional components that are well known in the art. Since the electric device 12 is well known in the art, this component will not be discussed or illustrated in detail herein. Rather, it will be apparent to those skilled in the art from this disclosure that the components can be any type of structure and/or programming that can be used to carry out the present invention.

GENERAL INTERPRETATION OF TERMS

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section,"

"portion," "member" or "element" when used in the singular can have the dual meaning of a single part or a plurality of parts. Also as used herein to describe the above embodiment, the following directional terms "forward", "rearward", "above", "downward", "vertical", "horizontal", "below" and "transverse" as well as any other similar directional terms refer to those directions of a vehicle equipped with the multi-receptacle housing assembly. Accordingly, these terms, as utilized to describe the present invention should be interpreted relative to a vehicle equipped with the multi-receptacle housing assembly.

The terms of degree such as "substantially", "about" and "approximately" as used herein mean a reasonable amount of deviation of the modified term such that the end result is not significantly changed.

While only selected embodiments have been chosen to illustrate the present invention, it will be apparent to those skilled in the art from this disclosure that various changes and modifications can be made herein without departing from the scope of the invention as defined in the appended claims. For example, the size, shape, location or orientation of the various components can be changed as needed and/or desired. Components that are shown directly connected or contacting each other can have intermediate structures disposed between them. The functions of one element can be performed by two, and vice versa. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such features. Thus, the foregoing descriptions of the embodiments according to the present invention are provided for illustration only, and not for the purpose of limiting the invention as defined by the appended claims and their equivalents.

What is claimed is:

1. A multi-receptacle housing assembly comprising:
    an electrical device housing having a projection extending from an upper surface thereof;
    a plurality of electrical receptacles, each electrical receptacle having a clamping end and a terminal end, the terminal end having electrical connector openings;
    a clamping assembly having a first clamping member, a second clamping member and a cover support section, the first clamping member having a lower section configured to clamp to a first side of the projection, the second clamping member having a lower section configured to clamp to a second side of the projection, an upper section of the first clamping member and an upper section of the second clamping member being configured to receive and support a plurality of electric receptacles therebetween such that with the first clamping member and the second clamping member being drawn toward one another clamping to the projection, the upper sections of the first and second clamping members clamping the clamping ends of each of the plurality of electrical receptacles therebetween with the terminal end and the electrical connector openings being exposed, the cover support section being attached to at least one of the first clamping member and the second clamping member; and
    a cover removably connected to the cover support section of the clamping assembly covering the upper section of the first clamping section, the upper section of the second clamping member and the cover support section, the cover defining an opening with a portion of each of the plurality of electrical openings extending there through such that the terminal end and the electrical connector openings of each of the plurality of electric receptacles is exposed.

2. The multi-receptacle housing assembly according to claim 1, wherein
    each of the first clamping member and the second clamping member of the clamping assembly further defines a cable receiving section configured to receive a plurality of cables extending from the electronic device housing to corresponding ones of the clamping ends of the plurality of electric receptacles.

3. The multi-receptacle housing assembly according to claim 1, wherein
    the clamping assembly includes mechanical fasteners threadedly connecting the first clamping member to the second clamping member such that rotation of the mechanical fasteners changes clamping force between the first clamping member and the second clamping member.

4. The multi-receptacle housing assembly according to claim 3, wherein
    each of the first clamping member and the second clamping member has an elongated plate-like shape, each of the first clamping member and the second clamping member has a first recessed area dimensioned to receive the projection of the electronic device housing and a second recessed area dimensioned to receive the plurality of electric receptacles.

5. The multi-receptacle housing assembly according to claim 3, wherein
    each of the first clamping member and the second clamping member has a cable receiving opening.

6. The multi-receptacle housing assembly according to claim 3, wherein
    the cover support section includes at least one end block attached to a first end of the first clamping member and a first end of the second clamping member, with the cover being attached to the end block.

7. The multi-receptacle housing assembly according to claim 1, further comprising
    a plurality of electrical plugs, each plug having electrical pins extending therefrom, the electrical pins being inserted into corresponding ones of the electrical connector openings of the plurality of electrical receptacles.

8. A multi-receptacle housing assembly comprising:
    an electrical device housing having a projection extending from an upper surface thereof;
    a plurality of electrical receptacles, each electrical receptacle having a clamping end and a terminal end, the terminal end having electrical connector openings;
    a first clamping member;
    a second clamping member, each of the first clamping member and the second clamping member having respective first ends and second ends with a first recessed area being defined along lower edges of the first and second clamping members between the first ends and the second ends thereof, and a second recessed area being defined along upper edged of the first and second clamping members between the first ends and the second ends thereof, the first recessed areas being dimensioned and shaped such that the first and second clamping members clamp to the projection of the electrical device and the second recessed areas being dimensioned and shaped to clamp to the clamping ends of each of the plurality of electrical receptacles;

clamping elements connecting the first clamping member to the second clamping member such that operation of the clamping elements changes distance between the first clamping member and the second clamping member; and a cover removably connected to the first ends and the second ends of the first and second clamping members, the cover defining an opening that with a portion of each of the plurality of electrical receptacles extending therethrough such that the terminal end and the electrical connector openings of each of the plurality of electric receptacles is exposed.

9. The multi-receptacle housing assembly according to claim 8, wherein
the first clamping member defines a clamping surface adjacent to the first recessed area, the first recessed area of the first clamping member having a recessed surface parallel to the clamping surface and spaced apart from the clamping surface by a first distance measured in a direction perpendicular to the clamping surface.

10. The multi-receptacle housing assembly according to claim 9, wherein
the second recessed area of the first clamping member has a main surface parallel to the clamping surface and spaced apart from the clamping surface by a second distance greater than the first distance as measured in a direction perpendicular to the clamping surface.

11. The multi-receptacle housing assembly according to claim 8, further comprising
at least one end block attached to the first end of the first clamping member and the first end of the second clamping member, with the cover being attached to the end block.

12. The multi-receptacle housing assembly according to claim 8, wherein
the first clamping member defines a cable receiving opening that extends from a first surface of the first clamping member to a second surface of the clamping member, the second surface being defined adjacent to the first recessed area.

13. The multi-receptacle housing assembly according to claim 8, further comprising
a plurality of electrical plugs, each plug having electrical pins extending therefrom, the electrical pins being inserted into corresponding ones of the electrical connector openings of the plurality of electrical receptacles.

14. A multi-receptacle housing assembly comprising:
an electronic device housing having a projection extending therefrom and having a plurality of first electric contacts, a first group of the plurality of first electric contacts being located along a first side of the projection and a second group of the plurality of first electric contacts being located along a second side of the projection;

a clamping assembly defining a first clamping section and a second clamping section, the first clamping section being located along a lower side of the clamping assembly and clamped to the projection of the electronic device housing, the second clamping section being located along an upper side of the clamping assembly;

a plurality of electrical receptacles, each electrical receptacle having a clamping end and a terminal end, the terminal end having electrical connector openings with second electrical contacts disposed within the electrical connector openings, the clamping end of each of the plurality of electrical receptacles being installed to the second clamping section;

a plurality of cables, each cable being connected to the second electric contacts of corresponding ones of the plurality of electrical receptacles and further connected to one of the plurality of first electric contacts; and a cover removably connected to opposite ends of the clamping assembly, the cover defining an opening with a portion of each of the plurality of electrical openings extending therethrough such that the terminal end and the electrical connector openings of each of the plurality of electric receptacles is exposed.

15. The multi-receptacle housing assembly according to claim 14, wherein
the clamping assembly further defines a cable receiving section configured to receive the plurality of cables.

16. The multi-receptacle housing assembly according to claim 14, wherein
the clamping assembly includes a first clamping member, a second clamping member and mechanical fasteners threadedly connecting the first clamping member to the second clamping member such that rotation of the mechanical fasteners changes clamping force between the first clamping member and the second clamping member at the first clamping section.

17. The multi-receptacle housing assembly according to claim 16, wherein
each of the first clamping member and the second clamping member has an elongated plate-like shape, each of the first clamping member and the second clamping member has a first recessed area with at least a portion of the projection of the electronic device housing being disposed therein, and
each of the first clamping member and the second clamping member has a second recessed area with lower ends of the plurality of electric receptacles retained therein.

18. The multi-receptacle housing assembly according to claim 16, wherein
each of the first clamping member and the second clamping member has a cable receiving opening with at least a portion of the plurality of cables extending therethrough.

19. The multi-receptacle housing assembly according to claim 16, further comprising
at least one end block attached to a first end of the first clamping member and a first end of the second clamping member, with the cover being attached to the end block.

20. The multi-receptacle housing assembly according to claim 14, further comprising
a plurality of electrical plugs, each plug having electrical pins extending therefrom, the electrical pins being inserted into corresponding ones of the electrical connector openings of the plurality of electrical receptacles.

* * * * *